United States Patent
Wang

(10) Patent No.: US 11,228,282 B2
(45) Date of Patent: Jan. 18, 2022

(54) H-BRIDGE POWER AMPLIFIER ARRANGEMENT

(71) Applicant: Telefonaktiebolaget LM Ericsson (publ), Stockholm (SE)

(72) Inventor: Zhancang Wang, Beijing (CN)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 16/967,210

(22) PCT Filed: Feb. 5, 2018

(86) PCT No.: PCT/CN2018/075233
§ 371 (c)(1),
(2) Date: Aug. 4, 2020

(87) PCT Pub. No.: WO2019/148484
PCT Pub. Date: Aug. 8, 2019

(65) Prior Publication Data
US 2021/0050819 A1   Feb. 18, 2021

(51) Int. Cl.
*H03F 3/217* (2006.01)
*H03F 1/02* (2006.01)
*H03F 3/195* (2006.01)
*H03F 3/24* (2006.01)

(52) U.S. Cl.
CPC ........... *H03F 1/0227* (2013.01); *H03F 3/195* (2013.01); *H03F 3/245* (2013.01); *H03F 2200/102* (2013.01); *H03F 2200/33* (2013.01); *H03F 2200/451* (2013.01)

(58) Field of Classification Search
CPC ...................................................... H03F 3/217
USPC ...................................... 330/251, 207 A, 146
See application file for complete search history.

(56) References Cited

U.S. PATENT DOCUMENTS

| | | | |
|---|---|---|---|
| 8,760,226 B2 * | 6/2014 | Gilbert | H03F 3/2171 330/10 |
| 2007/0126504 A1 | 6/2007 | Macphail | |
| 2009/0153242 A1 | 6/2009 | Cygan et al. | |

(Continued)

FOREIGN PATENT DOCUMENTS

| | | |
|---|---|---|
| CN | 201854182 U | 6/2011 |
| EP | 2432118 B1 | 12/2012 |
| EP | 2395656 B1 | 8/2018 |

OTHER PUBLICATIONS

Wentzel, Andreas, et al., "An 8W GaN-Based H-Bridge Class-D PA for the 900 MHz Band Enabling Ternary Coding", IEEE MTT-S International Microwave Symposium Digest, 2012, 3 pages.

(Continued)

*Primary Examiner* — Henry Choe
(74) *Attorney, Agent, or Firm* — Withrow & Terranova, PLLC

(57) ABSTRACT

An H-bridge power amplifier arrangement with envelope tracking is disclosed. The power amplifier arrangement comprises four elements form the four corner bars of a first H-bridge structure with a load formed as the cross bar of the first H-bridge structure. The power amplifier arrangement further comprises a rectifier circuit coupled between the first positive power supply and the third positive power supply configured to recycle the sinking envelope current.

14 Claims, 6 Drawing Sheets

(56) References Cited

U.S. PATENT DOCUMENTS

2012/0044020 A1\* 2/2012 Siniscalchi ........... H03F 3/2173
                                                    330/251
2013/0285750 A1   10/2013 Chowdhury et al.
2016/0065134 A1\* 3/2016 Lu ........................ H03F 3/217
                                                    330/251

OTHER PUBLICATIONS

International Search Report and Written Opinion for International Patent Application No. PCT/CN2018/075233, dated Nov. 7, 2018, 10 pages.
Extended European Search Report for European Patent Application No. 18904100.7, dated Jul. 23, 2021, 8 pages.

\* cited by examiner (a)

(b)

H-BRIDGE POWER AMPLIFIER ARRANGEMENT

This application is a 35 U.S.C. § 371 national phase filing of International Application No. PCT/CN2018/075233, filed Feb. 5, 2018, the disclosure of which is incorporated herein by reference in its entirety.

TECHNICAL FIELD

Embodiments herein relate to an H-bridge power amplifier arrangement. In particular, they relate to an H-bridge power amplifier arrangement with envelope tracking and sinking current recycling, and an electronic circuit and apparatus comprising the power amplifier arrangement.

BACKGROUND

Power amplifiers (PA) are ubiquitous in wireless communication equipment or device. The efficiency of radio frequency (RF) PA is generally defined as a ratio between the desired transmitted radio power and the total power from a supply, which is rather low in the future wideband applications with traditional PA architectures. Consequently, extensive efforts are made within the wireless communication industry for the means of enhancing efficiency. A small improvement in PA efficiency can make substantial profit available in a wireless communication system or terminal and cut the overall costs needed to operate the system or terminal.

In the wireless communication infrastructure industry, one technique that is utilized to enhance RF PA efficiency is envelope tracking (ET). ET is a known approach to RF PA design in which the power supply voltage applied to the PA is constantly adjusted in relation to the envelope of the RF signal to ensure that the PA is operating at peak efficiency over output power range. Thus, when the envelope of the RF signal increases, the voltage supplied to the power amplifier can be increased. Likewise, when the envelope of the RF signal decreases, the voltage supplied to the power amplifier can be decreased to reduce power consumption.

Wireless communication systems implement a variety of RF power amplifier topologies. The current trend towards highly linear multi-carrier RF transmitters and microwave transmitters having high power efficiency requires more sophisticated circuit topologies, such as class F amplifiers, Doherty amplifiers, and various switch mode RF power amplifier families. Due to the rigorous noise requirements of the new generation wireless communication systems, some linear power amplifier, such as classes A, AB and B, are forced to operate at low power efficiency, which increase the operating costs of the wireless communication network.

With the surge of data services in emerging 5G system and beyond, modern wireless communication evolution has employed highly spectrum efficient digital modulation schemes. On the other hand, they impose stringent linearity requirements on RF transmitters for base stations (BTS) and mobile user equipment (UE) applications. In other words, a number of challenges for efficient PA implementation arise with the growing peak-to-average-power ratio (PAPR), broadband performance and rigorous linearity requirements. As one of the most promising solutions, ET PA has evoked extensive concentration due to highly efficient operation over broad power range and its frequency agility to handle the band fragmentation in 5G system and beyond.

Advanced wireless communications demand higher data throughputs. It achieves high modulation rate based on the complex digital modulation schemes such as quadrature amplitude modulation (QAM) or orthogonal frequency division multiplexing (OFDM). However, it results in signals with ever increased PAPR even more than 10 dB. Furthermore, these high PAPR signals require to be backed off significantly from the peak power level of the RF PA, leading to poor average efficiency.

In EP2432118, an RF power amplifier with fast envelope tracking is disclosed. The RF power amplifier comprises an RF power amplifying device and a switching DC/DC converter for providing said RF power amplifying device with a DC power supply at a voltage level proportional to an envelope of said RF signal. There are two main defects in the ET PA, which are linearity issue and efficiency degradation issue when average power is greatly backed off.

In Andreas W., et al. "*An 8W GaN-Based H-Bridge Class-D PA for the 900 MHz Band Enabling Ternary Coding*", Microwave Symposium Digest (MTT), 2012 IEEE MTT-S International, 2012, an H-bridge class-D PA with binary input voltages, a hybrid output network, i.e. a bandpass filter and a single-ended load is disclosed. The H-bridge class-D PA amplifier includes two complementary voltage mode class-D PAs with four transistors. The H-bridge configuration is operated simply as two voltage-mode PAs, thus doubling the output power. However, it has low efficiency for high PAPR signals, e.g. in 4G/5G system.

Therefore there is a need for improved power amplifier systems. Furthermore, there is a need for improved envelope trackers for controlling power amplifier supply voltage.

SUMMARY

It is an object of embodiments herein to provide a power amplifier arrangement with improved performance on envelope tracking, linearity and efficiency.

According to one aspect of embodiments herein, the object is achieved by an H-bridge power amplifier arrangement with envelope tracking. The power amplifier arrangement comprises a first element comprising a first, a second and a third terminal. The first terminal is configured to receive an envelope signal as a control signal, the second terminal is coupled to a first positive power supply. The first element is configured to generate a sourcing envelope current.

The power amplifier arrangement further comprises a second element comprising a first, a second and a third terminal. The first terminal is configured to receive an inverse-phase version of the envelop signal, the second terminal is coupled to the first positive power supply. The second element is configured to generate a sinking envelope current to compensate a redundant sourcing current generated by the first element.

The power amplifier arrangement further comprises a third element comprising a first, a second and a third terminal. The first terminal is configured to receive input signals, the second terminal is coupled to the third terminal of the second element to form a first interconnection node, and the third terminal is coupled to a negative power supply. The third element is configured to amplify the received input signals, and the first interconnection node is coupled to a second positive power supply.

The power amplifier arrangement further comprises a fourth element comprising a first, a second and a third terminal. The first terminal is configured to receive an inverse-phase version of the input signals, the second terminal is coupled to the third terminal of the first element to form a second interconnection node, the third terminal is coupled to the negative power supply via a third positive power supply. The fourth element is configured to amplify the received inverse-phase version of the input signals, and the second interconnection node is coupled to the second positive power supply.

The power amplifier arrangement further comprises a load coupled between the first and second interconnection nodes to form a path for both the sourcing and sinking envelope currents. The first, second, third and fourth elements form the four corner bars of a first H-bridge structure with the load formed as the cross bar of the first H-bridge structure.

The H-bridge power amplifier arrangement further comprises a rectifier circuit coupled between the first positive power supply and the third positive power supply configured to recycle the sinking envelope current by converting a redundant sinking current power to a direct current (DC) voltage and feeding the DC voltage to the first positive power supply with the same voltage level.

In other words, according to the embodiments herein, the first element is an envelope signal amplification circuitry configured to receive an input envelope signal indicative of an envelope of an input radio frequency signal and to generate an amplified envelope signal as a power supply for the third element which is a main RF power amplifier. The second element is an envelope correction circuitry configured to receive an inversion-phase of the envelope signal and generate a power supply for the fourth element which is an auxiliary RF power amplifier.

Unlike traditional prior arts which treat the envelope tracking system as two separated elements such as a supply modulator and an RF power amplifier, the embodiment herein considers the supply modulator and RF power amplifier as a whole via a novel "H" bridge structure for integration. There are three signal paths in the H-bridge power amplifier arrangement. Firstly, an envelope tracking sourcing path, i.e. the first element, the load and the third element, which provides the main ET PA function supplied by dual supply rails, i.e. the first positive power supply and the second positive power supply. Secondly, an envelope tracking sinking path, i.e. the second element, the load and the fourth element, which provides the signal correction due to the redundant current generated from the sourcing path to provide the auxiliary sinking function for ET PA to improve its linearity by triple supply rails, i.e. the first, second and third positive power supplies. Finally, a sinking power recycling path, i.e. the rectifier circuit, which provides sinking power reuse for the whole ET PA system via a RF to DC rectification process.

Some advantages of the H-bridge structure according to embodiments herein include:

Simplicity of the ET PA system;

Enable analog or full digital transmitter under the same transmitter architecture;

Use sinking current branch to improve linearity of the ET PA system by controlling scheme. The H-bridge structure makes the sinking current direct to the RF load for signal correction and further efficiency enhancement;

Enable easy ET mode to average power tracking (APT) mode transformation when average output power is greatly backed off by turning off the first and second elements and using the second positive power supply directly and changing it slowly to realize APT function; and Enable efficiency enhancement by introducing H-bridge sinking current recycling.

Therefore, the embodiment herein provides a power amplifier arrangement with improved performance on envelope tracking, linearity and efficiency.

BRIEF DESCRIPTION OF THE DRAWINGS

Examples of embodiments herein are described in more detail with reference to attached drawings in which.

DETAILED DESCRIPTION

Figure 1:
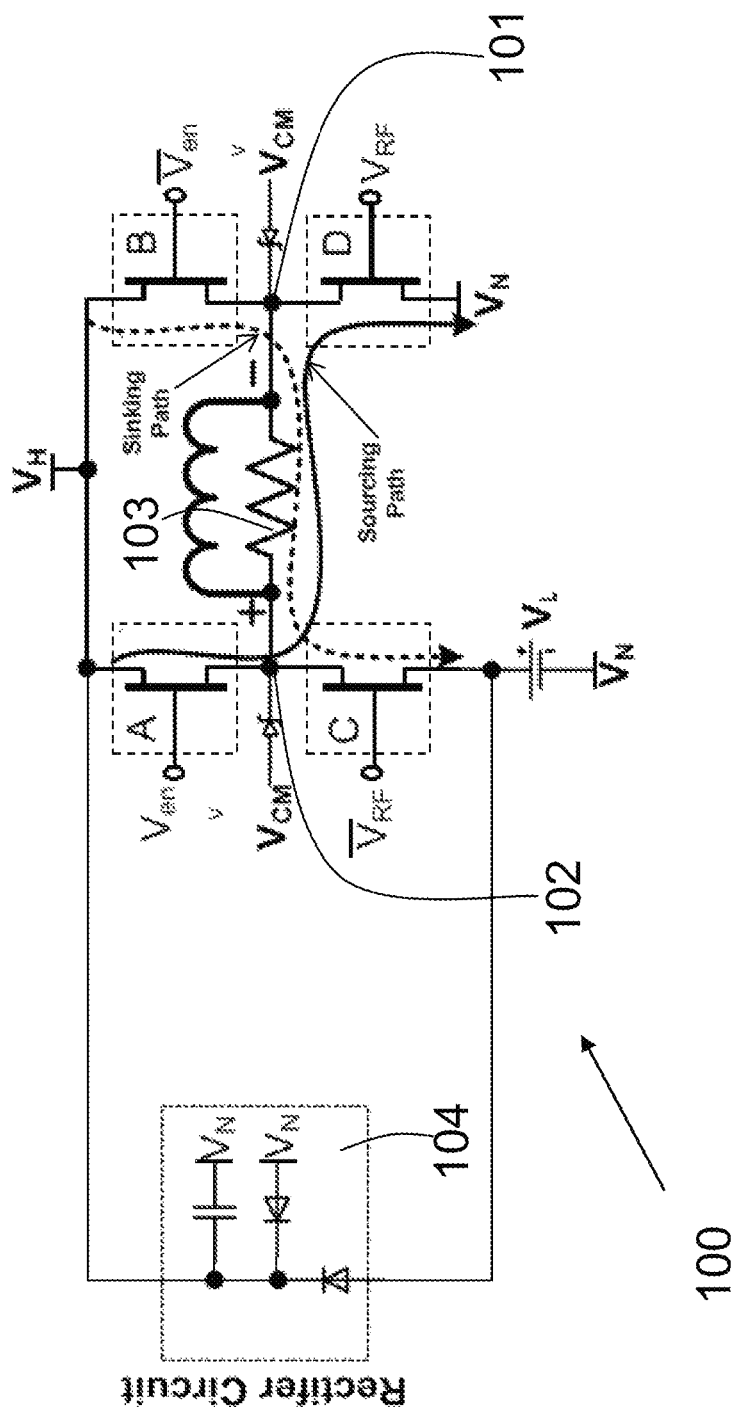
FIG. 1 is a schematic block illustrating an H-bridge power amplifier arrangement according to embodiments herein.

FIG. 1 shows an H-bridge power amplifier arrangement 100 with envelope tracking according to embodiments herein, hereafter refereed as H-bridge ET PA. Unlike traditional prior arts which treat the envelope tracking system as a supply modulator and an RF power amplifier as two separated elements, the present embodiment considers supply modulator and RF power amplifier as a whole via a novel "H" bridge structure for integration. As shown in FIG. 1, the H-bridge power amplifier arrangement 100 comprises a first element A comprising a first, a second and a third terminals. The first terminal is configured to receive an envelope signal Ven as a control signal, the second terminal is coupled to a first positive power supply $V_H$. The first element A is configured to generate a sourcing envelope current represents the main power amplification supply current sourcing.

The H-bridge power amplifier arrangement 100 further comprises a second element B comprising a first, second and third terminals. The first terminal is configured to receive an inverse-phase version of the envelope signal $\overline{V}en$, the second terminal is coupled to the first positive power supply $V_H$. The second element B is configured to generate an inverted polarity supply or generate a sinking envelope current to compensate a redundant sourcing current generated by the first element A.

The first and second elements A and B are very high frequency (VHF) band operating transistors or circuitry to handle envelope domain signals.

The H-bridge power amplifier arrangement 100 further comprises a third element D comprising a first, second and third terminals. The first terminal is configured to receive input signals $V_{RF}$, the second terminal is coupled to the third terminal of the second element B to form a first interconnection node 101, the third terminal is coupled to a negative power supply $V_N$. The third element D is configured to amplify the received input signals. The first interconnection node 101 is coupled to a second positive power supply $V_{CM}$ via e.g. a diode.

The H-bridge power amplifier arrangement 100 further comprises a fourth element C comprising a first, second and third terminals. The first terminal is configured to receive an inverse-phase version of the input signals $\overline{V}_{RF}$, the second terminal is coupled to the third terminal of the first element A to form a second interconnection node 102, the third terminal is coupled to the negative power supply $V_N$ via a third positive power supply $V_L$. The fourth element C is configured to amplify the received inverse-phase version of the input signals. The second interconnection node 102 is coupled to the second positive power supply $V_{CM}$ via e.g. a diode.

The third and fourth elements D and C are RF power transistors, which receive its power supply both current and voltage from the first and second elements A and B respectively. The third element D is the main RF power amplification stage for RF input signals. The fourth element C is weak auxiliary RF power amplifier to amplify the inverse version of the RF signals for signal correction due to redundant power supply effect from the first element A. The third element D is always "ON" for power amplification, whereas the fourth element C is periodically "ON" and "OFF" during envelope cycles for signal correction and sinking process.

H-bridge structure is so named because it has four elements at the "corners" of an "H" and an RF load forms the cross bar. So the H-bridge power amplifier arrangement 100 further comprises a load 103 coupled between the first and second interconnection nodes 101/102 to form a path for both the sourcing and sinking envelope currents. The first, second, third and fourth elements form the four corner bars of a first H-bridge structure with the load 103 formed as the cross bar of the first H-bridge structure.

The first, second, third and fourth elements A, B, D, C may be transistors, current sources (CSs) or switches. Anything that can carry a current will work, from four single-pole-single-throw (SPST) switches, one double-pole-double-throw (DPDT) switch, to enhancement mode power Metal-Oxide-Semiconductor Field-Effect Transistors (MOSFETs) and Bipolar Junction Transistors (BJTs). H-bridge architecture will absorb the drain-source parasitic capacitance (Cds) related distortion and efficiency degradation issue.

The H-bridge power amplifier arrangement 100 further comprises a rectifier circuit 104 coupled between the first positive power supply $V_H$ and the third positive power supply $V_L$ configured to recycle the sinking envelope current by converting a redundant sinking current power to a direct current (DC) voltage and feeding the DC voltage to the first positive power supply $V_H$ with the same voltage level.

The H-bridge power amplifier arrangement 100 with envelope tracking may be either linear mode or switch mode which depends on what kind of the "ABCD" elements and input signal pattern will be applied. Therefore, the present embodiment does not limit to neither linear/analog nor switch/pulse mode signal application scenarios.

In operation, the four elements/CSs/switches ABCD are turned on in pairs, either A and D, or C and D. However what is different from any other H-bridge prior arts who never both switches "ON" the same "side" of the H-bridge, the present embodiment utilizes both "ON" but different gain or scaling factor and phase to let one pair of elements e.g. B and C to sink the redundant current generated from the other envelope tracking pair e.g. A and D. It means the scenario that A may provide more current than what D demand. Then it might introduce distortion via supply modulation effect to the final RF PA output. When both elements/CSs/switches on one side of the H-bridge are turned on, it will create a short circuit between the power source positive supply and power source negative supply. Although this phenomena is called shoot through in the Switch-Mode Power Supply (SMPS) prior arts, it can be utilized under envelope tracking scheme to sink the redundant current generated and alleviate supply modulation related distortion by means of controlling "On" and "Off" condition/intervals and the current amplitude of shoot through. If the H-bridge is sufficiently powerful it will absorb that differential load and the power sources will simply drain quickly. Hence, there is a sinking current recycling rectification scheme to handle the wasted power and boost system efficiency as shown in FIG. 1.

Therefore there are three signal paths in the H-bridge power amplifier arrangement 100. Firstly, an envelope tracking sourcing path, i.e. the first element A, the load 103 and the third element D, which provides the main ET PA function supplied by dual supply rails, i.e. the first positive power supply $V_H$ and the second positive power supply, i.e. the common mode supply $V_{CM}$. Secondly, an envelope tracking sinking path, i.e. the second element B, the load 103 and the fourth element C, which provides the signal correction due to the redundant current generated from the sourcing path to provide the auxiliary sinking function for ET PA to improve its linearity by triple supply rails, i.e. the first, second and third positive power supplies $V_H$, $V_{CM}$, $V_L$. Finally, a sinking power recycling path, i.e. the rectifier circuit 103, which provides sinking power reuse for the whole ET PA system via a RF to DC rectification process.

For supply rails, there are four supplies nominal. However, in practice it can be simplified to fewer numbers. They are power source positive $V_H$, power source negative $V_N$, common mode supply $V_{CM}$ which provide the root mean squared supply voltage level of ET PA output; and low supply source $V_L$ which is provided for power recycling scheme functionality. The first, second and third positive power supplies $V_H$, $V_{CM}$, $V_L$ may be ranging in high, middle and low levels with respect to each other.

To power the H-bridge power amplifier arrangement 100, it is necessary turn on two elements that are diagonally opposed. In the FIG. 1, when the first element A and third element D are turned on. The current flow is shown in a solid line. At the same time, the other diagonally opposed path will not be turned on until the redundant current is generated, as shown in a dashed line. Then, it will slightly be turned on and drain the redundant current into the recycling path for RF to DC rectification. The condition of triggering sinking path working is realized by controlling the dynamic gate bias driven levels.

Both the sourcing and sinking current will flow through the load 103. The current flows and the load begins to turn in a "positive" direction when the sourcing path starts to work. On the other hand, when turning on the second and fourth elements, current flows the other direction through the load 103 and counteracts the distortions on the load 103 caused by the redundant sourcing current. Here, the load 103 can be seen as a summing node, which have the "positive" direction current and the opposite direction current flowing through at the same time. However, when there is NO redundant current generated, the opposite current flowing is zero and the sinking path is totally shut down.

In theory, the operation quadrants of the present embodiment may be very flexible. It depends on how to control the H-bridge power amplifier arrangement 100 well for efficiency and linearity trade-off. If each element can be controlled independently then some flexible control and configuration schemes with the H-bridge ET PA may be realized. Hence, an H-bridge in the present embodiment should be a "four quadrant device". For example, if it is built out of a single DPDT switch, it may be only controlled forward or reverse. As each switch has one of two states, and there are four switches, there are 16 possible states. However, since any state that turns both switches on one side at some moments is no longer "bad", there are in fact only three useful states, i.e. three operation modes, where the transistors are turned on, compared to any other H-bridge prior arts, as shown in Table 1.

TABLE 1

| A | B | C | D | Quadrant Operation Description |
|---|---|---|---|---|
| On | Off | Off | On | Perfect ET operation without any redundant current generated in sourcing path. No sinking is needed. |
| Off | On | On | Off | ET not working, but sinking path "ON". An error state needs to be avoided. |
| On | On | Off | Off | Supply modulator is all "ON"; but RF PAs are all "OFF". ET PA does not work. |
| Off | Off | On | On | Supply modulators are all "OFF"; but RF PAs are all "ON" with fixed DC supply $V_{CM}$, working for low power mode. This is a state which transformed from envelope tracking (ET) to average power tracking (APT). |
| On | On | On | On | ET operation with any redundant current generated in sourcing path. Sinking function is needed to remove distortion. |

Therefore, based on the quadrant operation descriptions in Table 1, according to some embodiments herein, the first and third elements A and D may be controlled to be on, the second and fourth elements B and C may be controlled to be off.

According to some embodiments herein, the first and second elements A and B may be controlled to be off, the third and fourth elements D and C may be controlled to be on.

According to some embodiments herein, the first, second, third and fourth elements A, B, D, C may be controlled to be on.

The present embodiment may provide additional benefit to traditional ET PA by adding sinking path function to linearize the ET PA and mode transition from ET to APT when the average power requirement is greatly reduced.

The ET and APT mode transition is widely realized by turning off the linear part of hybrid structure supply modulator. Only switch mode part will work to provide DC supply. In present embodiment, $V_{CM}$ is replacing switch mode part in prior art hybrid supply modulator, $V_{CM}$ may be variable and changing slowly to realize APT function to satisfy ET and APT requirements.

All in all, the present embodiment is addressing the sinking current issue of all prior arts ET solutions. Most of them are using sinking current to keep high linearity of envelope tracking supply modulator. However, the sinking current are wasted or recycled to power supply. All of these not direct reuse the sinking current. Hence, the present embodiment proposed to use H-bridge envelope tracking to make the sinking current direct to RF load for signal correction and for further efficiency enhancement as shown in FIG. 1. On the other hand, the present embodiment can be easily transferred into APT mode by simply turning off supply modulation elements e.g. A and B, using $V_{CM}$ as DC supply voltage directly and $V_{CM}$ may also be slowly changeable supply source.

The technical implementation of the present invention can be categorized as two types as linear mode and switch mode. Linear mode H-Bridge ET PA handles analog signal with linear amplification; switch mode H Bridge ET PA handles pulse mode stimulus as full digital transmitter.

Figure 2:
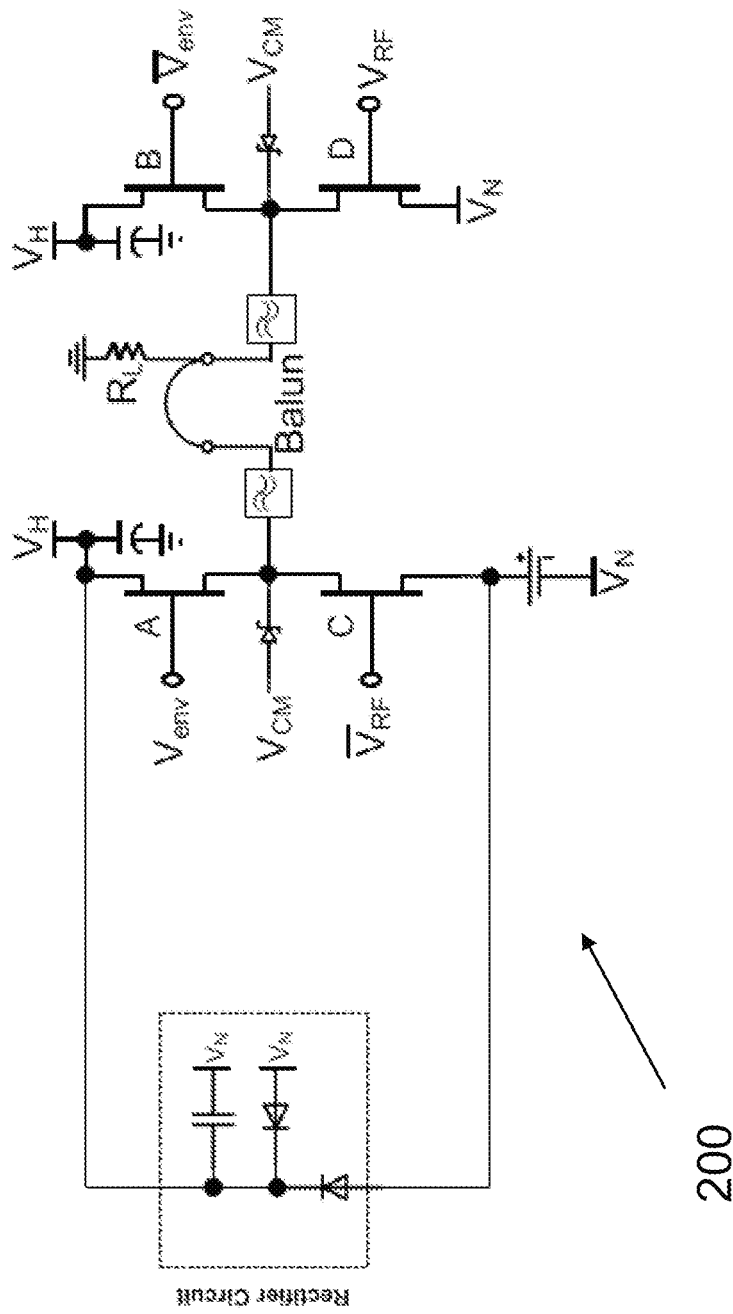
FIG. 2 is a simplified schematic view of an example implementation of a linear H-bridge power amplifier arrangement according to embodiments herein.

FIG. 2 shows an example implementation of a linear H-Bridge ET PA. The input signal $V_{RF}$ is an analog RF signal, whose frequency is much higher than the envelope signal frequency. The first and second elements A and B are transistors working at envelope frequency e.g. DC ~100 MHz; while the fourth and third elements C and D are RF power transistors working at high frequencies e.g. 700~2700 MHz for telecommunications purpose. Between the envelope domain and RF domain configurations, there is common mode voltage source $V_{CM}$ which is typical root mean squared value of the ET PA output. The value of $V_{CM}$ may be approximate half or lower values of the sum of positive and negative supply rails $V_H$ and $V_N$. A pair of Schottky diodes Diode is employed between $V_{CM}$ and the joint junction to provide dual supply rails for envelope tracking supply modulation. The principle of this operation is that if the instant supply voltage is greater than $V_{CM}$ value, the first element A will provide tracking supply to the third element D. If instant supply voltage is equal or lower than $V_{CM}$, then the first element A will be shut down and $V_{CM}$ is supplied via the Schottky diode to the third element D. In this case, the lower part of ET supply will be clipped by $V_{CM}$ values. While the instant supply voltage lower than $V_{CM}$ supply waveform will be provided by the sinking path BC, which will provide some compensation of "troughs" of the ET PA system. However, the second and fourth elements B and C are not working all the time, when the envelope supply waveform is below a certain threshold, it will trigger them to turn on to sink current. The sinking current is not go to the negative power source or ground directly. There is a lower supply source $V_L$, which is lower than the minimum value of the ET supply voltage $V_H$. $V_L$ is inserted between the source of C transistor and the negative power supply $V_N$. There is a rectifier to pull out the sinking power from $V_L$ to a feedback path named sinking current recycling path, which can avoid dissipate too much power by sinking current operation. The recycling circuitry is a rectenna rectifier circuit to convert RF power into proper DC level which may be suitable to be provided to $V_H$ and reused again.

The RF transistors C and D may be matched into either linear mode power amplifier such as Class-A/AB/B or switch mode power amplifier such as Class-E/F/F$^{-1}$/J/P etc. to boost the peaking efficiency of the ET PA system. Linearization scheme such as digital pre-distortion may be added into the chains of the fourth and third elements C and D as well for linearity enhancement.

Figure 3:
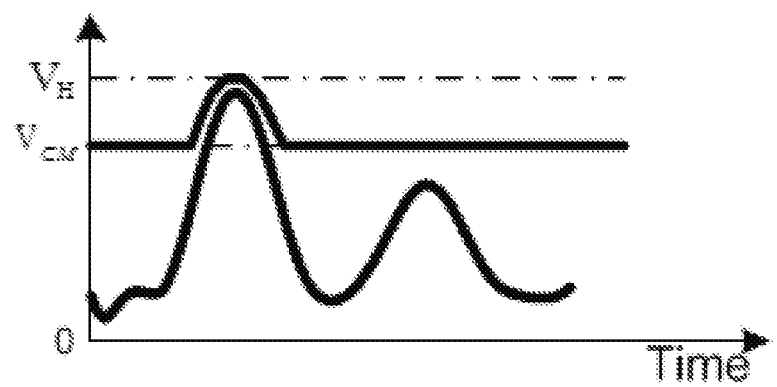
FIG. 3 is a diagram illustrating envelope modulation scheme according to embodiments herein.
Figure 3:
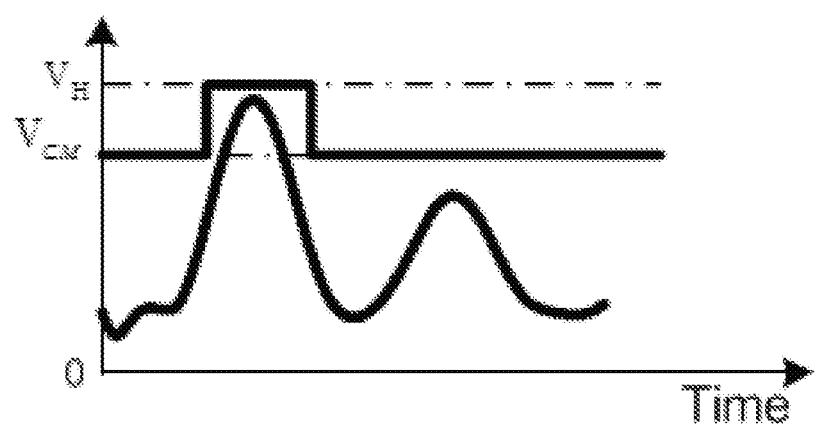

FIG. 3 shows transistors A and B plus Diode envelope modulation scheme according to embodiments herein, where (a) is linear mode H-bridge configuration and (b) is switch mode H-bridge configuration. As shown in FIG. 3, for the envelope domain signal processing, transistor A/B plus Diode modulation scheme may provide better supply modulation efficiency than single A and B supply modulation scheme, because it uses multiple supply rails and switching between them to boot average efficiency to fit for the probability density function (PDF) of high peak to average power ratio (PAPR) envelope amplifications. To deal with efficiency challenge from high-PAPR signal, the present embodiments have usually two supply voltage levels as $V_H$ and $V_{CM}$, they can adapt power supply voltages to fit the required output power to some extent. When the amplitude of the output voltage is lower than $V_{CM}$, then transistor A will be shut down and $V_{CM}$ is supplied via the Schottky diode to transistor D. When the amplitude of the output voltage is higher than $V_{CM}$, then transistor A is turned on, $V_H$ will be supplied to transistor D. The higher and lower supply voltages $V_H$ and $V_{CM}$ are defined by both the maximum output power required and the minimum supply voltage that the supply modulation circuitry can operate above a pre-defined threshold for the total harmonic distortion (THD) performance defined. Switching supply voltages between two rails minimizes the amount of energy that needs to be dissipated by reducing the difference between the supply voltage and the output voltage. The ratio between the higher and lower supply voltages $V_{CM}/V_H$ may be adjusted to move peak efficiency point to fit to the average envelope power and achieve the best efficiency. With the intention to move peak efficiency point to tolerate more back-offs, the $V_{CM}/V_H$ ratio may be set to a smaller value, e.g. 0.5, so the peak efficiency point is moved to lower voltage region. Whereas, there may be a peak efficiency drooping effect and deeper drop-down between two peak-efficiency points while tuning $V_{CM}/V_H$ ratio value into smaller values because of various non-ideal effects in practical components, backed off peak efficiency points may droop to some extent which may cause overall efficiency deviation from theoretical values.

According to some embodiments herein, the H-bridge ET PA may be implemented as fully digital solution which may be seen as a digital polar transmitter from system perspective.

Figure 4:
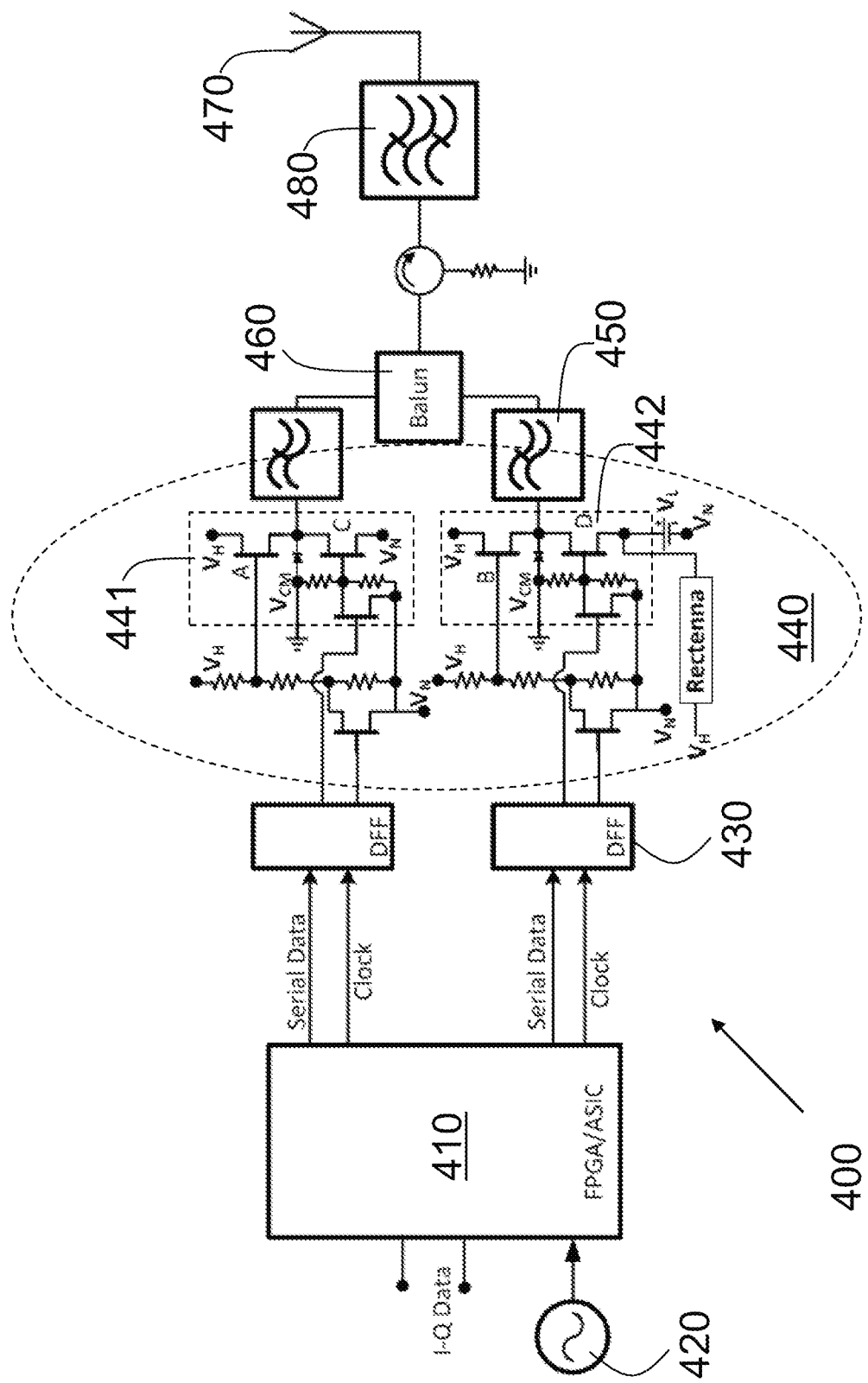
FIG. 4 is a schematic block illustrating a Direct Digital to RF Conversion Envelope Tracking (DDRFET) system with a digital H-Bridge ET PA scheme.

FIG. 4 shows a Direct Digital to RF Conversion Envelope Tracking (DDRFET) system with a digital H-Bridge ET PA scheme 400. The input signal may be binary digital signals or multiple levels digital signals with various digital modulation schemes. The base band digital signal, I-Q Data, is processed in a FPGA/ASIC 410 under synchronization of a reference clock 420. Then it outputs serial data and clock in differential mode. After digital flip flop circuitry DFF 430, digital envelope and RF signal are split and synchronized for the two arms 441, 442 of the H bridge 440. The H bridge 440 outputs the differential signal and being low pass filtered in LPF 450 to filter out the harmonic components to restore the analog waveform of RF/Microwave signal. A balun 460 works as a differential to single end converter to connect the antenna 470 and the H-bridge power amplifier system via a bandpass reconstruction filter 480.

Table 2 shows an example for Code Division Multiple Access (CDMA) modulation, where signal levels, H-Bridge gain reduction and peak to average power ratio (PAPR) of various digital signal modulation schemes are shown. By controlling the number of digital levels and digital encoding schemes, the PAPR and gain reduction may be achieved by selecting different signal coding format. From this perspective, the advantage of digital H-bridge ET PA may be more flexible to advanced system such as 5G and beyond.

TABLE 2

| Signaling Format | Generation | Modulation | Levels | Gain Reduction (dB) | Psat/Pavg (dB) |
|---|---|---|---|---|---|
| Conventional Analog | analog upmix | CDMA | ∞ | 0 | 8 |
| Binary PWM | digital upmix | " | 2 | −13.5 | 13.5 |
| Binary PDM | direct launch ΔΣ | " | 2 | −7.9 | 7.9 |
| Ternary PDM | direct launch ΔΣ | " | 3 | −1.7 | 6.1 |
| Quaternary PDM | direct launch ΔΣ | " | 4 | −0.6 | 6.1 |
| Quinternary PDM | direct launch ΔΣ | " | 5 | −0.25 | 6.05 |

Multiple levels signaling, such as ternary PDM, quaternary PDM, quinternary PDM with 3, 4, 5 levels respectively as shown in FIG. 4, has following advantages:
  Less gain reduction since gain reduction is detrimental to Power Added Efficiency (PAE)
  Well suited for non-constant envelope modulation since binary formats, i.e. constant envelope, are poorly suited for non-constant envelope modulation
  Ternary pulse-density modulation (PDM) offers good compromise between performance and system complexity.

Figure 5:
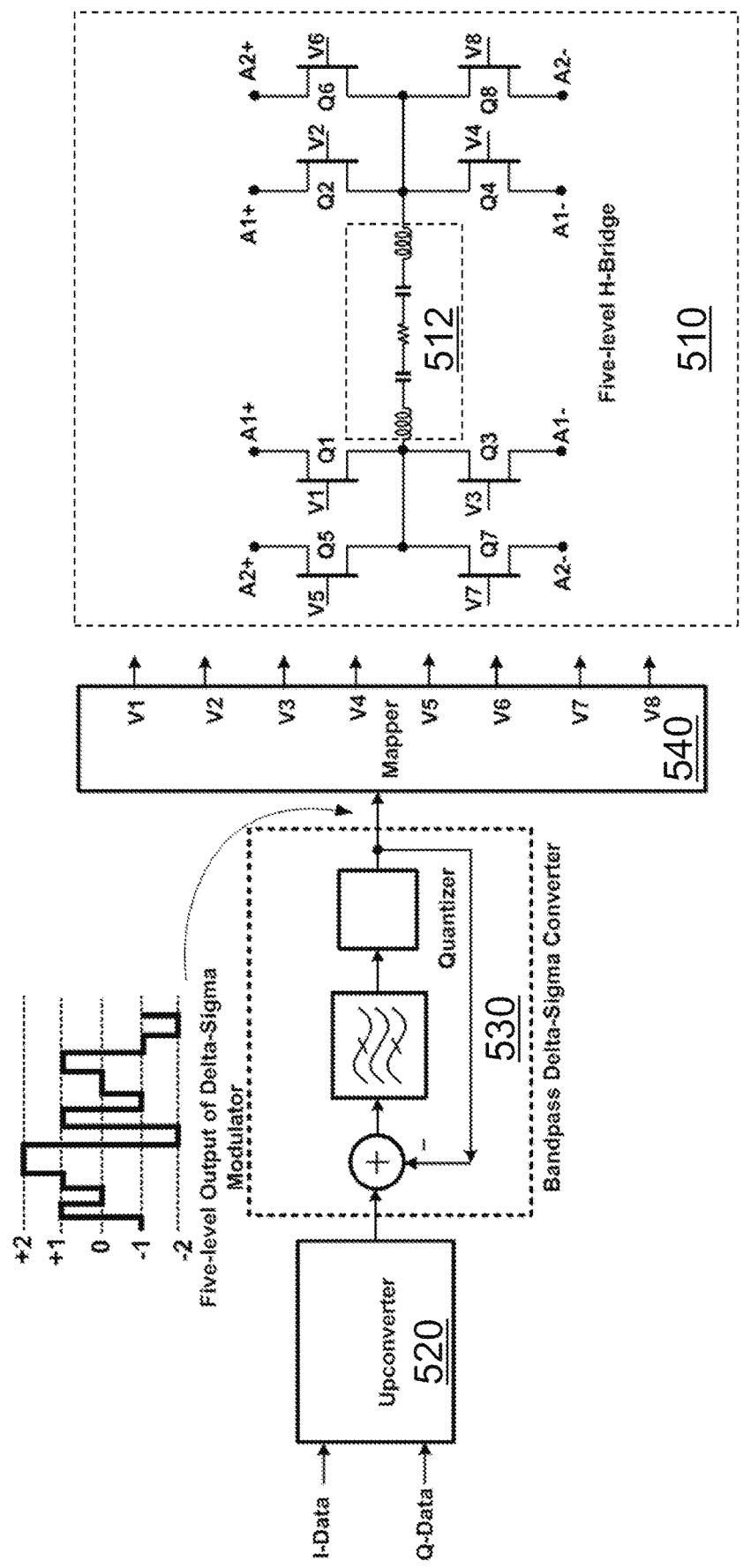
FIG. 5 is a schematic block illustrating multiple H-bridges power amplifier arrangement according to embodiments herein.

The principle of the multi-level signaling may be explained with reference to FIG. 5, where a multiple H-bridges power amplifier arrangement 510 together with digital signal processing unit is shown. To handle multilevel signals, the power amplifier arrangement 510 may comprise multiple H-bridge structures in cascade. The first H-bridge structure comprises transistors Q1-Q4 to handle signal levels V1-V4, the second H-bridge structure comprises transistors Q5-Q8 to handle signal levels V5-V8. The two H-bridge structures share the load 512. So the power amplifier arrangement may comprise multiple elements, e.g. more than four elements to form the four corner bars of a second H-bridge structure cascaded with the four corner bars of the first H-bridge structure As shown in FIG. 5, the quadrature digital signals I and Q are up-converted to carrier frequency Fc in a direct digital to RF converter 520, and then converted to 5-level digital signals in a bandpass delta-sigma converter 530. The 5-level digital signals are inputted to a mapper 540 to generate 8 voltage levels which are input signals to the cascaded multiple H-bridges power amplifier 510. Table 3 shows operating states of all 8 transistors in the multiple H-bridges power amplifier 510.

TABLE 3

| State | Q1 | Q2 | Q3 | Q4 | Q5 | Q6 | Q7 | Q8 |
|---|---|---|---|---|---|---|---|---|
| +2 | ON | OFF | OFF | ON | OFF | OFF | OFF | OFF |
| +1 | OFF | OFF | OFF | ON | ON | OFF | OFF | ON |
| 0 | OFF | OFF | OFF | OFF | OFF | OFF | ON | ON |
| −1 | OFF | OFF | OFF | OFF | OFF | ON | ON | OFF |
| −2 | OFF | ON | ON | OFF | OFF | OFF | OFF | OFF |

To summarize, according to embodiments herein, some advantages of the H-bridge power amplifier 100, 200, 410, 510 include:
  Simplicity of the ET PA system;
  Enable analog or full digital transmitter under the same transmitter architecture;
  Use sinking current branch to improve linearity of the ET PA system by controlling scheme. The H-bridge structure makes the sinking current direct to the RF load for signal correction and further efficiency enhancement;
  Enable easy ET mode to average power tracking (APT) mode transformation when average output power is greatly backed off by turning off the first and second elements A and B, and using the second positive power supply $V_{CM}$ directly and changing it slowly to realize APT function; and
  Enable efficiency enhancement by introducing "H" bridge sinking current recycling.

Figure 6:
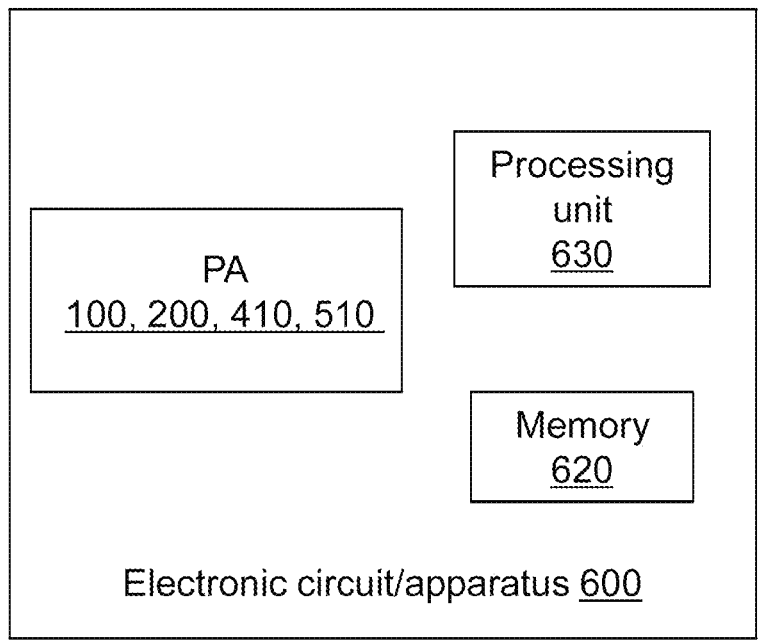
FIG. 6 is a block diagram illustrating an electronic circuit or apparatus in which embodiments herein may be implemented.

The H-bridge power amplifier arrangement 100, 200, 410, 510 according to the embodiments herein may be employed in various electronic circuits or apparatus. FIG. 6 shows a block diagram for an electronic circuit or apparatus 600. The electronic circuit or apparatus 600 comprises an H-bridge power amplifier arrangement 100, 200, 410, 510. The electronic circuit or apparatus 600 may be a transmitter or a transceiver in a cellular communications system/network. The electronic apparatus 600 may comprise other units, where a memory 620, a processing unit 630 are shown. The electronic apparatus 600 may be a user equipment or a mobile device, a wireless communication device, a radio base station for a cellular communication system.

Those skilled in the art will understand that the H-bridge power amplifier arrangement 100, 200, 410, 510 according to embodiments herein may be implemented by any semiconductor technology.

When using the word "comprise" or "comprising" it shall be interpreted as non-limiting, i.e. meaning "consist at least of".

The embodiments herein are not limited to the above described preferred embodiments. Various alternatives, modifications and equivalents may be used. Therefore, the above embodiments should not be taken as limiting the scope of the invention, which is defined by the appended claims.

The invention claimed is:

1. An H-bridge power amplifier arrangement with envelope tracking comprising:
   a first element comprising a first, a second and a third terminals, wherein the first terminal is configured to receive an envelope signal (Ven) as a control signal, the second terminal is coupled to a first positive power supply ($V_H$), and the first element is configured to generate a sourcing envelope current;
   a second element comprising a first, a second and a third terminals, wherein the first terminal is configured to receive an inverse-phase version of the envelope signal ($\overline{V}$en), the second terminal is coupled to the first positive power supply ($V_H$), and the second element is configured to generate a sinking envelope current to compensate a redundant sourcing current generated by the first element;
   a third element comprising a first, a second and a third terminals, wherein the first terminal is configured to receive input signals ($V_{RF}$), the second terminal is coupled to the third terminal of the second element to form a first interconnection node, the third terminal is coupled to a negative power supply ($V_N$), and the third element is configured to amplify the received input signals, and the first interconnection node is coupled to a second positive power supply ($V_{CM}$);
   a fourth element comprising a first, a second and a third terminals, wherein the first terminal is configured to receive an inverse-phase version of the input signals ($\overline{V}_{RF}$), the second terminal is coupled to the third terminal of the first element to form a second interconnection node, the third terminal is coupled to the negative power supply ($V_N$) via a third positive power supply ($V_L$), and the fourth element is configured to amplify the received inverse-phase version of the input signals, and the second interconnection node is coupled to the second positive power supply ($V_{CM}$);
   a load coupled between the first and second interconnection nodes to form a path for both the sourcing and sinking envelope currents; wherein the first, second, third and fourth elements form the four corner bars of a first H-bridge structure with the load formed as the cross bar of the first H-bridge structure; and
   the H-bridge power amplifier arrangement further comprising:
   a rectifier circuit coupled between the first positive power supply ($V_H$) and the third positive power supply ($V_L$) configured to recycle the sinking envelope current by converting a redundant sinking current power to a direct current, DC, voltage and feeding the DC voltage to the first positive power supply ($V_H$) with the same voltage level.

2. The power amplifier arrangement according to claim 1, wherein the voltages of the first, second and third positive power supplies ($V_H$, $V_{CM}$, $V_L$) are ranging in high, middle and low levels with respect to each other.

3. The power amplifier arrangement according to claim 1, wherein the first, second, third and fourth elements are transistors or switches.

4. The power amplifier arrangement according to claim 3, wherein the first and third elements are controlled to be on, the second and fourth elements are controlled to be off.

5. The power amplifier arrangement according to claim 3, wherein the first and second elements are controlled to be off, the third and fourth elements are controlled to be on.

6. The power amplifier arrangement according to claim 3, wherein the first, second third and fourth elements are controlled to be on.

7. The power amplifier arrangement according to claim 1, wherein the input signals are analog radio frequency signals, whose frequency is much higher than the envelope signal frequency.

8. The power amplifier arrangement according to claim 1, wherein the input signals are binary digital signals.

9. The power amplifier arrangement according to claim 1, wherein the input signals are digital signals comprising multiple levels.

10. The power amplifier arrangement according to claim 9, wherein the power amplifier arrangement comprises multiple H-bridge structures in cascade, and wherein the power amplifier arrangement comprises more than four elements to form the four corner bars of H-bridge structures cascaded with the four corner bars of the first H-bridge structure.

11. An electronic circuit comprising a power amplifier arrangement according to claim 1.

12. An electronic apparatus comprising a power amplifier arrangement according to claim 1.

13. The electronic apparatus according to claim 12, wherein the electronic apparatus is a wireless communication device for a cellular communication system.

14. The electronic apparatus according to claim 12, wherein the electronic apparatus is a radio base station for a cellular communication system.

* * * * *